(12) United States Patent
Hong et al.

(10) Patent No.: US 9,831,232 B2
(45) Date of Patent: Nov. 28, 2017

(54) ESD PROTECTION DEVICE

(71) Applicant: FREESCALE SEMICONDUCTOR, INC., Austin, TX (US)

(72) Inventors: Changsoo Hong, Phoenix, AZ (US); Patrice Besse, Tournefeuille (FR); Jean Philippe Laine, Saint Lys (FR); Rouying Zhan, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/058,184

(22) Filed: Mar. 2, 2016

(65) Prior Publication Data

US 2017/0098644 A1   Apr. 6, 2017

(30) Foreign Application Priority Data

Oct. 2, 2015   (WO) .................. PCT/IB2015/002294

(51) Int. Cl.
| | |
|---|---|
| H01L 29/66 | (2006.01) |
| H01L 27/02 | (2006.01) |
| H01L 29/06 | (2006.01) |
| H01L 29/08 | (2006.01) |
| H01L 29/87 | (2006.01) |
| H01L 29/10 | (2006.01) |
| H01L 29/74 | (2006.01) |
| H01L 27/07 | (2006.01) |

(52) U.S. Cl.
CPC ...... *H01L 27/0262* (2013.01); *H01L 29/0623* (2013.01); *H01L 29/0649* (2013.01); *H01L 29/0804* (2013.01); *H01L 29/0821* (2013.01); *H01L 27/0259* (2013.01); *H01L 27/0727* (2013.01); *H01L 29/1095* (2013.01); *H01L 29/7436* (2013.01); *H01L 29/87* (2013.01)

(58) Field of Classification Search
CPC ............. H01L 27/0262; H01L 29/7436; H01L 27/0255; H01L 27/0259; H01L 29/87; H01L 27/0727; H01L 29/66659; H01L 29/1095; H01L 29/0619; H01L 29/0623; H01L 29/0653
USPC ............... 257/173, 187, 409, 455, 525, 526; 438/48, 235, 309
See application file for complete search history.

(56) References Cited

U.S. PATENT DOCUMENTS

| | | |
|---|---|---|
| 6,441,437 B1 | 8/2002 | Gossner |
| 6,717,219 B1 | 4/2004 | Vashchenko et al. |
| 6,878,581 B1 | 4/2005 | Liu et al. |

(Continued)

OTHER PUBLICATIONS

Gossner, H. et al.: "Wide Range Control of the Sustaining Voltage of ESD Protection Elements Realized in a Smart Power Technology", Electrical Overstress/Electrostatic Discharge Symposium Proceedings, Sep. 28-30, 1999, pp. 99-19-99-27.

*Primary Examiner* — Thinh T Nguyen

(57) ABSTRACT

An electrostatic protection includes a buried layer having an outer region and an inner region which are heavily doped regions of a first conductivity type. The inner region is surrounded by an undoped or lightly doped ring region. The ring region is surrounded by the outer region. The device further includes a semiconductor region over the buried layer, a first well of the first conductivity type in the semiconductor region, a first transistor in the semiconductor region, and a second transistor in the semiconductor region. The first well forms a collector of the first transistor and a collector of the second transistor.

9 Claims, 11 Drawing Sheets

(56) References Cited

U.S. PATENT DOCUMENTS

| | | |
|---|---|---|
| 7,023,028 B2 | 4/2006 | Jensen |
| 7,427,787 B2 | 9/2008 | Steinhoff |
| 8,390,092 B2 | 3/2013 | Gendron et al. |
| 8,994,068 B2 | 3/2015 | Zhan et al. |
| 2003/0001216 A1* | 1/2003 | de Fresart ........... H01L 29/0653 |
| | | 257/409 |
| 2004/0135141 A1 | 7/2004 | Pequignot et al. |
| 2005/0082603 A1 | 4/2005 | Fujii |
| 2006/0094149 A1 | 5/2006 | Chen et al. |
| 2008/0088993 A1 | 4/2008 | Entringer et al. |
| 2011/0176243 A1 | 7/2011 | Zhan et al. |
| 2011/0176244 A1 | 7/2011 | Gendron et al. |
| 2012/0119331 A1 | 5/2012 | Gendron et al. |
| 2012/0133025 A1 | 5/2012 | Clarke et al. |
| 2014/0061716 A1 | 3/2014 | Zhan et al. |
| 2014/0225156 A1 | 8/2014 | Zhan et al. |
| 2015/0102384 A1 | 4/2015 | Zhan et al. |
| 2016/0300828 A1 | 10/2016 | Laine et al. |

* cited by examiner

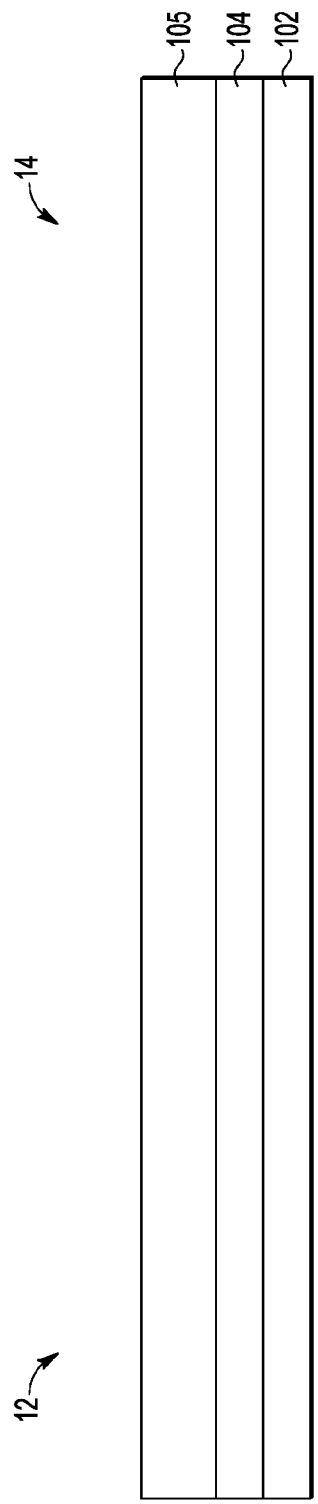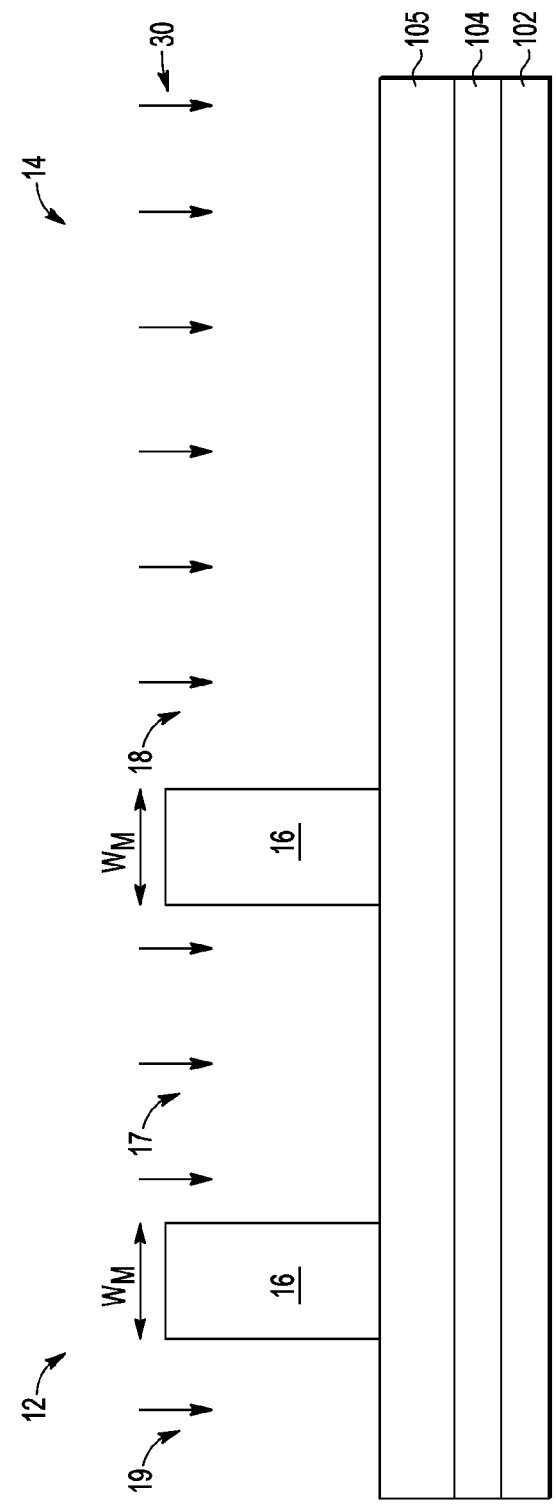

ESD PROTECTION DEVICE

CROSS REFERENCE TO RELATED APPLICATION(S)

The present application claims priority to International Patent Application No. PCT/IB2015/002294, entitled "ESD PROTECTION DEVICE," filed on Oct. 2, 2015, the entirety of which is herein incorporated by reference.

FIELD OF USE

The present disclosure relates generally to semiconductor devices, and more specifically, to semiconductor devices providing protection from electrostatic discharge (ESD).

BACKGROUND

Integrated circuits (ICs) and electronic assemblies, and the devices therein, are at risk of damage due to electrostatic discharge (ESD) events. This is well known in the art. It is therefore commonplace to provide an ESD protection clamp (voltage limiting device) across the terminals of such devices, IC's and electronic circuits or assemblies. As used herein, the term integrated circuit and the abbreviation IC are intended to refer to any type of circuit or electronic assembly whether formed in a monolithic substrate or as individual elements or a combination thereof.

BRIEF DESCRIPTION OF THE DRAWINGS

The disclosure is illustrated by way of examples and embodiments and is not limited by the accompanying figures. For simplicity and clarity of illustration, the figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention. The figures along with the detailed description are incorporated and form part of the specification and serve to further illustrate examples, embodiments and the like, and explain various principles and advantages, in accordance with the disclosure, where like reference numbers indicate similar elements.

FIG. 2 gives a cross-sectional view of an ESD protection device implemented in a semiconductor substrate at a processing stage in accordance with an embodiment of the invention.

FIG. 3 illustrates a cross-sectional view of the ESD protection device of FIG. 2 at a subsequent processing stage in accordance with an embodiment of the invention.

DETAILED DESCRIPTION

Figure 1:
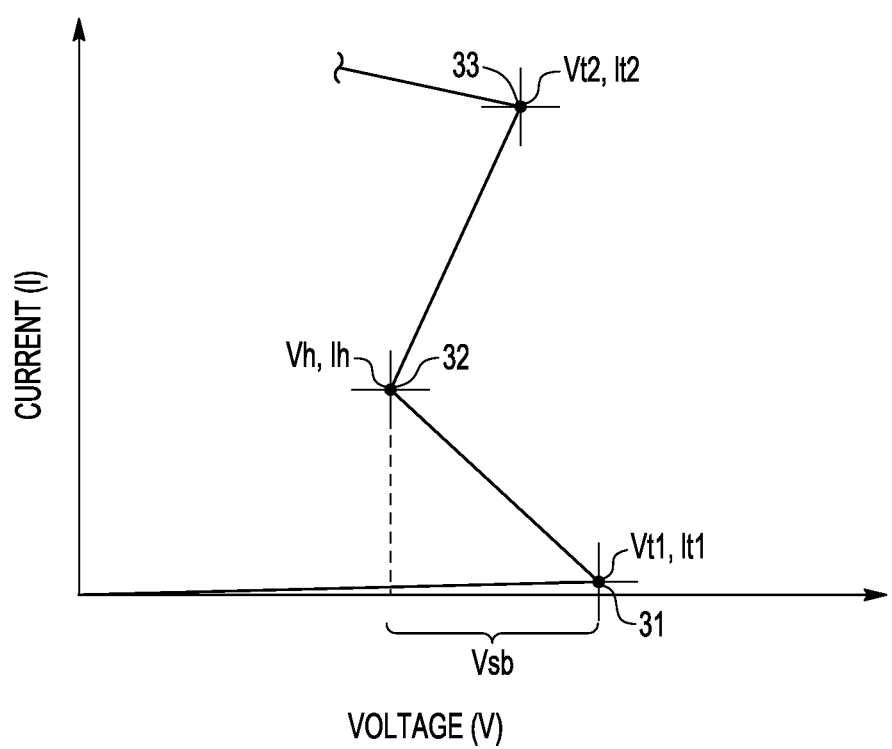
FIG. 1 shows a graph of a transmission line pulse (TLP) current (I) versus voltage (V) for a typical electrostatic discharge (ESD) protection device.

In a first aspect, an ESD protection device coupled between a first terminal and a second terminal of an integrated circuit is proposed. The ESD protection device comprises a buried layer having an outer region and an inner region which are heavily doped regions of a first conductivity type. The inner region is surrounded by a ring region which is an undoped or lightly doped ring-shaped region and which is surrounded by the outer region. The ESD protection device further comprises a semiconductor region over the buried layer; a first well of the first conductivity type in the semiconductor region, extending from a surface of the semiconductor region to a main region of the outer region of the buried layer; a first transistor in the semiconductor region having an emitter coupled to the first terminal; and a second transistor in the semiconductor region having an emitter coupled to the second terminal. The first well forms a collector of the first transistor and a collector of the second transistor. The buried layer is located below at least one of the first transistor and the second transistor. A high holding voltage Vh is achieved by a suitable choice of the width of the ring region.

A second aspect concerns a method for forming an ESD protection device coupled between a first terminal and a second terminal of an integrated circuit. The method comprises forming a ring-shaped masking layer over a first region of a first semiconductor layer, wherein the ring-shaped masking layer masks a ring region located in the first region of the first semiconductor layer. A dopant of a first conductivity type is implanted into the first semiconductor layer using the ring-shaped masking layer. The implanting results in a heavily doped inner region and a heavily doped outer region in the first semiconductor layer, wherein the ring region surrounds the inner region and the outer region surrounds the ring region. A second semiconductor layer is formed over the first semiconductor layer and the inner region and the outer region. A first well of the first conductivity type is formed in the second semiconductor layer, extending from a surface of the second semiconductor layer to a main region of the outer region. A first transistor in the second semiconductor layer is formed over the first semiconductor layer, the first transistor having an emitter coupled to the first terminal. A second transistor is formed in the second semiconductor layer over the first semiconductor layer. The second transistor has an emitter coupled to the second terminal. The first well forms a collector of the first transistor and a collector of the second transistor. A high holding voltage Vh is achieved by a suitable choice of the width of the ring-shaped masking layer.

ESD protection clamps are circuit elements used to protect integrated circuit (IC) devices from voltage and current spikes that may be associated with an electrostatic discharge. To protect an IC device, an ESD clamp is connected between an input or output terminal of the device and a ground or common terminal. During normal operation, the ESD clamp does not conduct. But when subjected to an excessive voltage, the ESD clamp becomes conductive, conducting current to ground and limiting voltage to a desired safe level, thereby protecting the IC to which the ESD clamp is connected.

Generally, ESD clamps can be connected across any terminals of an IC that constitutes the electronic device to be protected. Accordingly, any reference herein to a particular input or output terminal of an IC is intended to include any and all other terminals of electronic circuits, not merely those used for input or output signals. With respect to structures or elements used for ESD protection, the terms device, clamp and transistor are used interchangeably.

FIG. 1 is a graph showing a transmission line pulse (TLP) current (I) versus voltage (V) for a typical electrostatic discharge (ESD) protection device. In operation, as the voltage applied to the terminals is increased, very little current flows through the ESD protection device until the triggering voltage Vt1 at point 31 is reached. The value Vt1 refers to forward triggering voltage. Upon reaching the triggering voltage, the ESD protection device turns on and the voltage drops to the holding voltage Vh at point 32, in which the current flow through the device is Ih. The difference between the triggering voltage and the holding voltage is referred to as the snapback voltage, denoted Vsb. Depending upon the internal impedance of the voltage source, current and voltage may further increase to point 33 at current It2 and voltage Vt2, beyond which destructive failure may occur leading to further current increase accompanied by voltage decrease. Generally, It2 indicates the current capability of the ESD protection device before the device is thermally damaged.

A similar explanation applies to the reverse direction in a bi-polarity or bi-directional ESD protection device in which very little current flows through the ESD protection device until a reverse triggering voltage $Vt1_R$ is reached. At this point, the ESD protection device turns on and the voltage drops to a reverse holding voltage $Vh_R$. The reverse snapback voltage, $Vsb_R$, is the difference between the reverse triggering voltage and the reverse holding voltage. As will be described in more detail below, the forward behavior and reverse behavior of a bi-directional ESD protection device may not be symmetrical. Accordingly, the ESD protection device may be optimized for either a forward or reverse ESD event.

In high-voltage or high-power ESD clamp implementations (e.g., those used in the automotive industry) ESD clamps having a higher snapback voltage (Vsb) generally provide improved latch-up immunity. Typically, the snapback voltage and holding voltage of an ESD protection device is a constant voltage which is defined by the process technology used in manufacturing the ESD protection device. However, in some applications, this holding voltage value is not sufficient. For example, in one application, an electrical disturbance from the battery, such as for a reverse double battery event, may be on the order of 28 V. In this situation, the holding voltage needs to remain above 28 V in order for the ESD device to remain within allowable limits. Therefore, in one embodiment, a buried N type layer, as will be described below, is used to control or adjust the holding voltage by controlling the internal resistance of the ESD protection device.

FIG. 2 is a cross-sectional view of an ESD protection device 100 implemented in a semiconductor substrate at an initial stage in processing in accordance with an embodiment of the invention. ESD protection device 100 is a dual polarity (bi-directional) ESD clamp device for use in protecting electronic devices and circuits. As will be described below, the ESD protection device will include two mirrored and interconnected transistors 124 and 126 (see FIG. 7) and may be incorporated into an ESD protection clamp.

Illustrated in FIG. 2 is a substrate 102 on which ESD protection device 100 is formed. Substrate 102 is a semiconductor substrate and is provided with a buried oxide layer (BOX) 104. Depending upon the implementation, substrate 102 may be either of N-type or P-type. Substrate 102 includes a region 12 in which a first of the two mirrored interconnected transistors, transistor 124, will be formed and a region 14 in which a second of the two mirrored interconnected transistors, transistor 126, will be formed. Buried oxide layer 104 provides electrical isolation to devices formed over substrate 102.

As used herein, the term "semiconductor" is intended to include any semiconductor whether single crystal, polycrystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline structures, amorphous structures, thin film structures, layered structures as, for example and not intended to be limiting, semiconductor-on-insulator (SOI) structures, and combinations thereof. For convenience of explanation and not intended to be limiting, semiconductor devices and methods of fabrication are described herein for silicon semiconductors but persons of skill in the art will understand that other semiconductor materials may also be used. Additionally, various device types and/or doped semiconductor regions may be identified as being of N type or P type for convenience of description and not intended to be limiting, and such identification may be replaced by the more general description of being of a "first conductivity type" or a "second, opposite conductivity type" where the first type may be either N or P type and the second type then is either P or N type.

Still referring to FIG. 2, a semiconductor layer 105 is formed over BOX layer 104. In one embodiment, semiconductor layer 105 is epitaxially deposited over BOX layer 104 and may be either N-type or P-type doped. In one embodiment, semiconductor layer 105 has a thickness in a range of 1 micrometer (μm) to 4 μm. As will be described below, an N-type buried layer (NBL) will be formed in semiconductor layer 105 using an appropriate masking layer and implantation. Adjacent regions 12 and 14 of substrate 102 may also be referred to as a first region and a second region, respectively, of semiconductor layer 105.

FIG. 3 illustrates ESD protection device 100 at a subsequent stage in processing in accordance with one embodiment. A ring-shaped masking layer 16 is formed over semiconductor layer 105 and includes openings 17, 18, 19. In one embodiment, ring-shaped masking layer 16 is formed by forming a photoresist layer over semiconductor layer 105 and then patterning the photoresist layer to form openings 17-19. Ring-shaped masking layer 16 covers a ring-shaped region of semiconductor layer 105 in the first region 12 and has openings 17 and 19 over semiconductor layer 105 in the first region 12 and an opening 18 over semiconductor layer 105 in the second region 14. An implant 30 is then injected or diffused into semiconductor layer 105 via the openings 17-19 to form doped regions within semiconductor layer 105 as defined by openings 17-19. Implant 30 enters semiconductor layer 105 in those regions exposed by the photoresist material and is blocked from entering semiconductor layer 105 in those regions covered by photoresist material.

In one embodiment, implant 30 is performed using an N-type dopant such as antimony, phosphorus, or suitable combinations thereof. In one embodiment, implant 30 has a concentration of $2 \times 10^{15}$ cm$^{-2}$.

Figure 4:
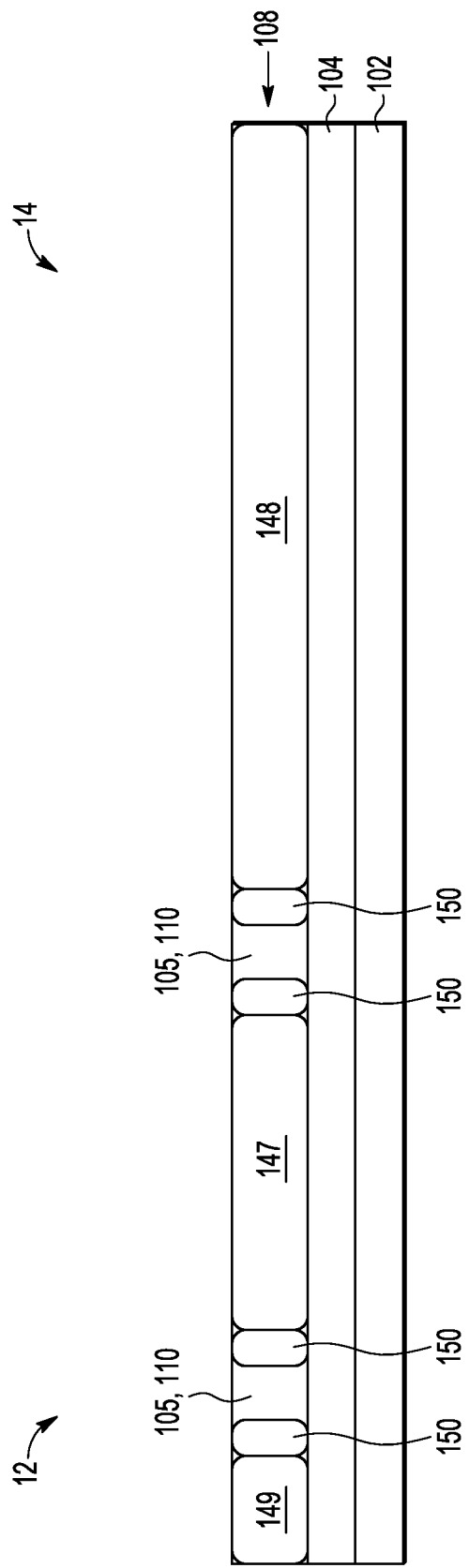
FIG. 4 illustrates a cross-sectional view of the ESD protection device of FIG. 3 at a subsequent processing stage in accordance with an embodiment of the invention.

FIG. 4 illustrates ESD protection device 100 at a subsequent stage in processing, after removal of ring-shaped masking layer 16. Implant 30 into semiconductor layer 105 results in highly doped regions 147-149 which are aligned to the openings in ring-shaped masking layer 16, such as openings 17-19. After implant 30, dopants may laterally diffuse from the highly doped regions by about, e.g., 0.5 um to 1 um laterally, resulting in a laterally diffused region 150 around the highly doped regions. Laterally diffused region 150 has a lower dopant concentration than the highly doped regions. For example, the highly doped regions may have a dopant concentration of about $1 \times 10^{16}$ cm$^{-3}$ to about $1 \times 10^{19}$ cm$^{-3}$, while laterally diffused region 150 has a dopant concentration of about $5 \times 10^{15}$ cm$^{-3}$ to about $1 \times 10^{18}$ cm$^{-3}$ Doped regions 147-149 and laterally diffused region 150 form an N-type buried layer (NBL) 108. Due to ring-shaped masking layer 16, NBL 108 is formed throughout in region 14 but only partly in region 12. In region 12, semiconductor layer 105 includes a ring-shaped undoped region 110 (ring region) resulting from ring-shaped masking layer 16. Therefore, NBL 108 may be described as having an opening in region 12 in which an undoped portion of semiconductor layer 105 is in direct contact with BOX layer 104. In region 14, NBL 108 provides a continuous doped layer. As will be discussed below, the undoped region in semiconductor layer 105 allows for NBL 108 to have an increased electrical resistance.

In alternate embodiments, a P-type buried layer, similar to NBL 108, may be formed in which implant 30 is performed using a P-type dopant and ring-shaped masking layer 16.

Figure 5:
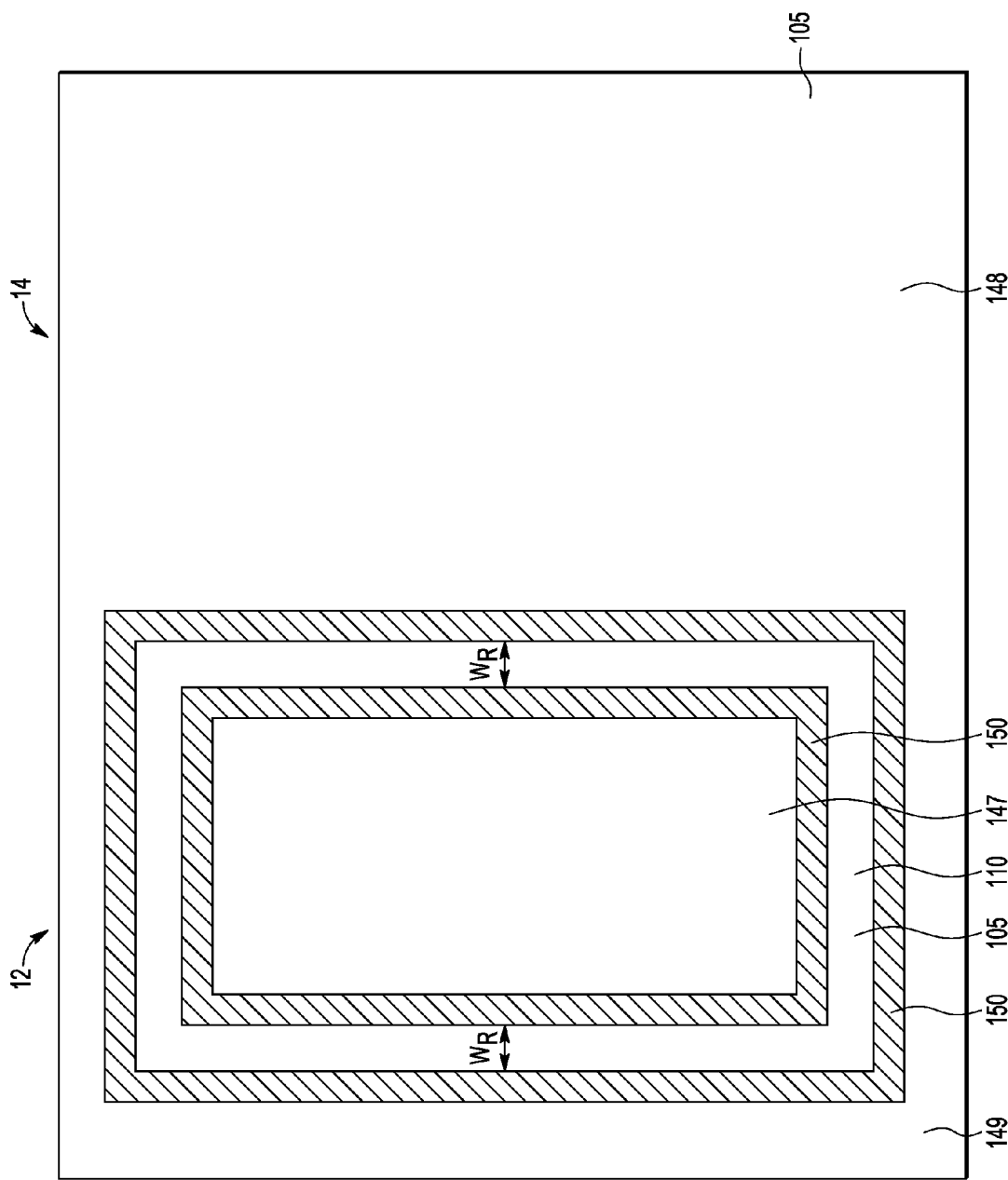
FIG. 5 illustrates a top down view of a portion of the ESD protection device of FIG. 4 in accordance with an embodiment of the invention.

FIG. 5 illustrates a top down view of a portion of ESD protection device 100 of FIG. 4 in accordance with various embodiments. Openings 17-19 of ring-shaped masking layer 16, which define the highly doped regions 147-148, include an inner opening 17 and outer openings 18 and 19. Outer openings 18 and 19 are mutually connected and constitute a single outer opening 18, 19 separate from and surrounding the inner opening 17. For example, as can be understood from FIG. 5, inner opening 17 may be rectangular.

The ring-shaped masking layer 16 results in a highly doped region 147, 148, 149 which includes an outer region 148, 149 and an inner region 147. Outer region 148, 149 includes a main region 148 located in region 14 and an edge region 149 located in region 12. Inner region 147 is located as an isolated island within outer region 148, 149. Inner region 147 is surrounded by ring region 110 which separates inner region 147 from outer region 148, 149. Ring region 110 is a ring-shaped, undoped region of semiconductor layer 105. In the example, ring region 110 is the only undoped region of semiconductor layer 105. Inner region 147, outer region 148, 149, and ring region 110 are located in a plane parallel to a major surface 103 of NBL 108. Note that major surface 103 of NBL 108 is parallel to a major surface of ESD protection device 100 (and also corresponds to a major surface of semiconductor layer 105 in which NBL 108 is formed) and is parallel to the plane of projection of FIG. 5. Therefore, the major axes of inner region 147, the major axis of the outer region 148, 149, and any diameter of the ring region 110 are parallel to major surface 103 of NBL 108. Laterally diffused region 150 is located at the borders of highly doped regions 147-149 in a plane parallel to major surface 103.

Undoped ring region 110 has a width $W_R$, which may be either constant or variable to some extent along the inner or outer circumference of ring region 110. In a good approximation, the width $W_R$ can be regarded as constant. In another embodiment, the width $W_R$ denotes an average width of the ring region 110, e.g., when the local width is averaged along the inner or outer circumference of the ring region 110. The inner circumference of ring region 110 is the outer circumference of inner region 147. The outer circumference of ring region 110 is the inner circumference of outer region 148, 149. For example, $0.5 \leq \mu m \ W_R \leq 3.0 \ \mu m$.

The ring-shaped masking layer 16 has a width $W_M$, determining the resulting width $W_R$ of the ring region 110. In one embodiment, the width $W_M$ of ring-shaped masking layer 16 is sufficiently large to prevent the lateral diffusion between adjacent highly doped regions to overlap, so as to provide the ring region 110 within NBL 108. In one such embodiment, the width $W_M$ of ring-shaped masking layer 16 is at least 0.5 μm. In another embodiment, the width $W_M$ is quite small (e.g., less than 0.5 μm) and, as a consequence, the lateral diffusion between adjacent highly doped regions meets or overlaps, resulting in a lightly doped ring region consisting of laterally diffused region 150. Laterally diffused region 150 may be referred to as lightly doped ring region 150 in this case.

Figure 6:
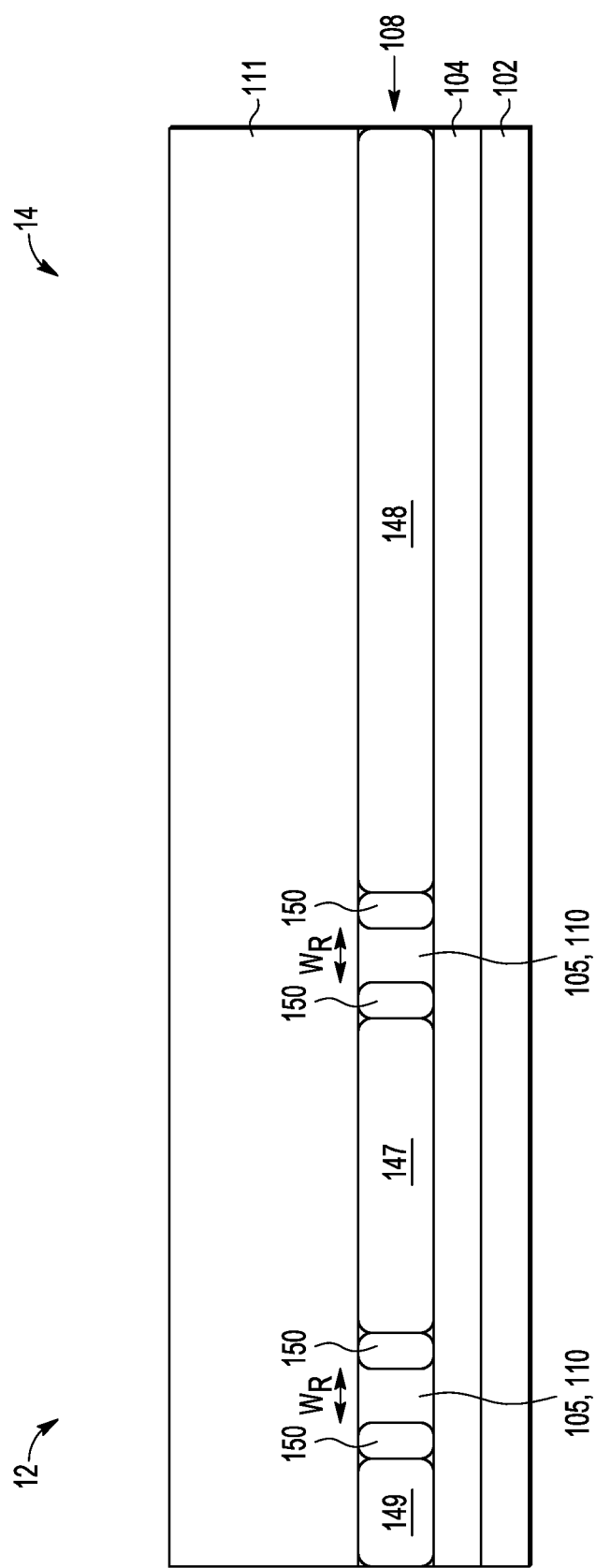
FIG. 6 illustrates a cross-sectional view of the ESD protection device of FIG. 5 at a subsequent processing stage in accordance with an embodiment of the invention.

FIG. 6 illustrates ESD protection device 100 at a subsequent stage in processing. After formation of the doped regions in semiconductor layer 105 to form NBL 108, a semiconductor layer 111 is formed over semiconductor layer 105 and NBL 108. In one embodiment, semiconductor layer 111 is formed by epitaxial deposition of silicon and may be either N-type or P-type doped. An example doping concentration range of region 111 is about $1 \times 10^{15}$ cm$^{-3}$ to about $8 \times 10^{15}$ cm$^{-3}$. As such, layer 111 may be relatively lightly doped. The thickness of layer 111 may, for example, be in the range of 3 μm to about 9 μm.

As shown in FIG. 6, NBL 108 is not continuous through ESD protection device 100. Instead, NBL 108, once formed, defines the ring region 110. That is, ring region 110 is located within an opening of NBL 108 in region 12. As such, NBL 108 does not form a continuous layer of N-type material formed across the surface of BOX layer 104. NBL 108 is continuous in region 14 but not in region 12. The combination of semiconductor layer 111 and the portions of semiconductor layer 105 which do not include NBL 108 (such as the portion of semiconductor layer 105 in ring region 110) may be referred to as a semiconductor region 112 (see FIG. 7). As such, region 112 is formed over NBL 108 and BOX layer 104. By ring region 110, region 112 comes into contact with BOX layer 104.

As mentioned above, the gap between inner region 147 and outer region 148, 149 can be small enough to allow the NBL lateral diffusions to meet in the middle to form a lighter doping NBL extension, e.g., in the form of a laterally diffused region 150 which will be ring-shaped. Laterally diffused region 150 may replace ring region 110 without qualitatively changing the operating characteristics of ESD protection device 100.

Figure 7:
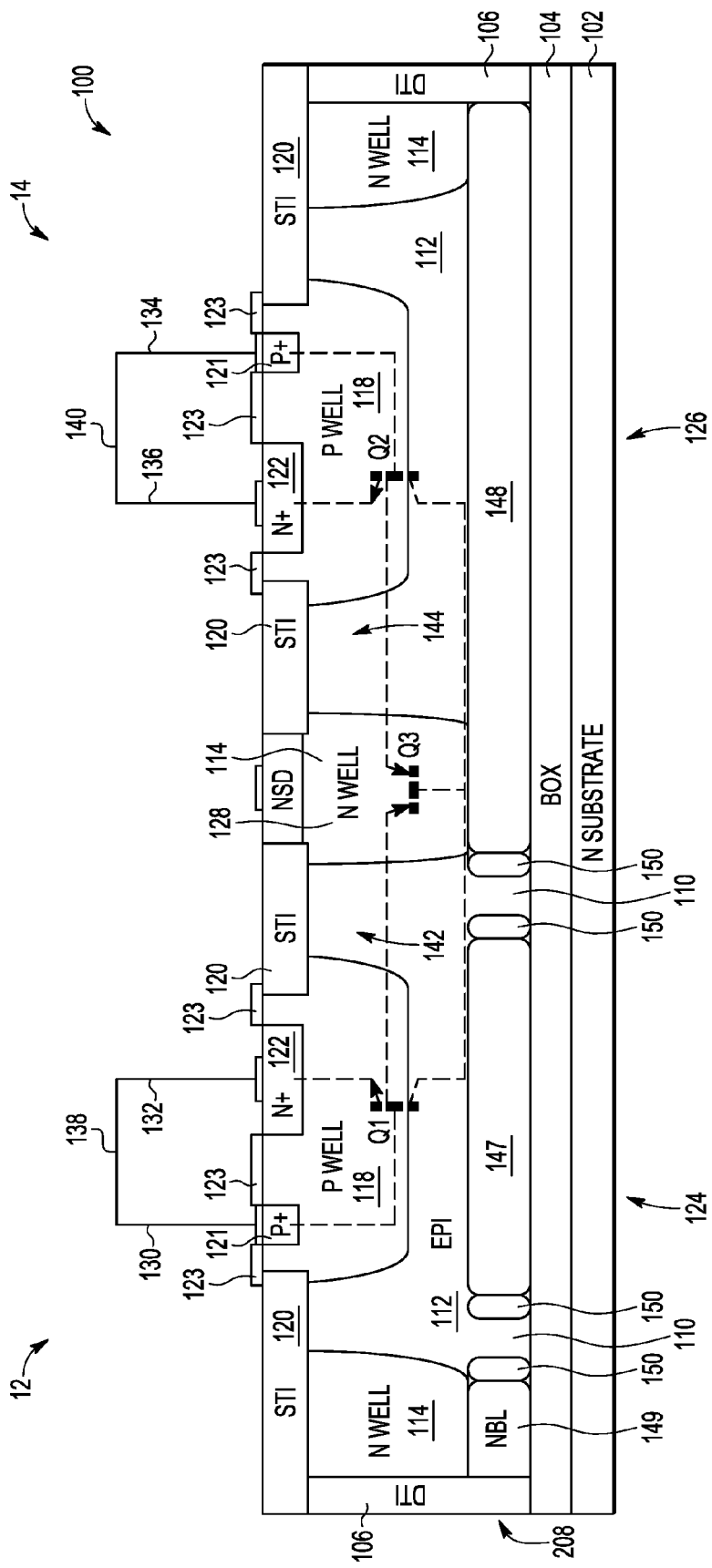
FIG. 7 illustrates a cross-sectional view of the ESD protection device of FIG. 6 at a subsequent processing stage in accordance with an embodiment of the invention.

FIG. 7 illustrates ESD protection device 100 at a subsequent stage in processing in which transistor 124 of ESD protection device 100 is formed in region 12 and transistor 126 of protection device 100 is formed in region 14. After formation of semiconductor layer 111 which results in region 112, a number of deep N-well regions 114 are formed in region 112. N well regions 114 may be doped with arsenic, phosphorus, antimony, or suitable combinations thereof. The peak doping density for N-well regions 114 may be in a range of about $1\times10^{17}$ cm$^{-3}$ to about $1\times10^{19}$ cm$^{-3}$ although other doping densities may also be used N-well regions 114 are formed to be in contact (and, therefore, in electrical communication with) NBL 108. Note that N-well regions 114 are in contact (and in electrically communication with) highly doped regions of NBL 108, such as regions 149, 147, and 148. In one embodiment, N-well regions 114 are formed such that the entire bottom of each deep N-well region contacts a highly doped region of NBL 108 and thus does not contact laterally diffused region 150.

After formation of N-well regions 114, a number of shallow trench isolation (STI) structures 120 are formed over a surface of device 100. The depth of STI structures 120 is usually in the range of about 0.05 µm to about 1 µm, more conveniently about 0.2 µm to about 0.5 µm, although thicker or thinner STI structures may also be used.

To fully isolate devices formed over substrate 102, deep trench isolation (DTI) regions 106 may be formed to provide electrically insulating walls around the devices. DTI regions 106 include dielectric materials that provide lateral electrical isolation to the device. Deep trench isolation regions may be provided extending from the surface of ESD device 100 to BOX 104. For example, DTI regions 106 extend through NBL 108 to BOX 104.

P-well regions 118 are formed within region 112. P-well regions 118 may be doped with boron or other suitable dopants. The peak doping density for P-well regions 118 is in the range of about $1\times10^{16}$ cm$^{-3}$ to about $1\times10^{19}$ cm$^{-3}$. The depth of P-well regions 118 may be in the range of 0.3 µm from the surface of device 100, to any location above or in contact with NBL 108, but other depth may also be used.

A number of silicide block regions 123 can be formed over the surface of device 100 to prevent reaction with a silicide forming conductor (that may be deposited over the device at a later time). In one embodiment, the silicide block regions 123 include a first layer of silicon oxide overlaying the surface, followed by a second layer of silicon nitride overlapping the first layer. While in another embodiment, the silicide block regions 123 may be omitted. In some cases, the silicide block regions 123 are replaced using shallow trench isolation (STI).

N+ doped contact regions 122 are formed in P-well regions 118. N+ contact regions 122 include relatively shallow, but highly doped N-type regions and may include phosphorus, arsenic, or suitable combinations thereof as dopants. The peak doping density for N+ contact regions 122 can be in the range of about $5\times10^{19}$ cm$^{-3}$ to about $1\times10^{21}$ cm$^{-3}$. The depth of N+ contact regions 122 can range from about 0.05 µm to about 0.3 µm. Other dopants, density and depths, though, may also be used.

P+ doped contact regions 121 are formed in P-well regions 118 to make electrical contact with P-well regions 118. P+ contact regions 121 include relatively shallow, but highly doped P regions and may include boron as a dopant. The peak doping density for P+ contact regions 121 is in the range of about $5\times10^{19}$ cm$^{-3}$ to about $1\times10^{21}$ cm$^{-3}$. The depth of P+ contact regions 120 can range from about 0.05 µm to about 0.3 µm. But other dopants, density and depths may also be used.

In the configuration shown in FIG. 7, the structure forms two NPN bipolar junction transistors 124 and 126, in which transistor 124 is formed in region 12 and transistor 126 in region 14. To illustrate the location and electrical interconnection of transistors 124 and 126 within the device, FIG. 7 includes a dashed schematic overlay showing the approximate location of a number of transistor structures within device 100. In the overlay, transistor 124 is represented by transistor Q1 and transistor 126 is represented by transistor Q2. In FIG. 7, transistors Q1, Q2, Q3 (described below), and their interconnections are only included for reference and do not form any portion of the structure of device 100. In FIG. 7, N+ doped regions 122 serve as the emitters of transistors 124 and 126. P-well regions 118 serve as the bases of transistors 124 and 126. The N-well region 128 (and connected NBL region 108) serves as the shared collector of transistors 124 and 126. The base and emitter terminals (130 and 132, respectively) of transistor 124 are tied together to form cathode terminal 138 for ESD protection device 100. The base and emitter terminals (134 and 136, respectively) of transistor 126 are tied together to form anode 140 terminal for ESD protection device 100. In this configuration, a parasitic PNP transistor structure is formed in device 100 at the approximate location of transistor Q3 in FIG. 7. N-well region 128 and the adjoining NBL region 108 serve as the base of the transistor structure Q3, and P-well regions 118 serve as the emitter and collector of transistor structure Q3. N-well region 128 also serves as a collector of transistor 124 and as a collector of transistor 126. In the present device, the main region 148 of outer region 148, 149 of NBL 108 formed under transistor 126 enables the operation of the parasitic PNP transistor structure Q3.

During a forward ESD event, when a positive voltage is applied to terminal 140 with respect to terminal 138, transistor 126 acts as a forward-biased diode, and transistor 124's base-collector junction is reverse biased. When a sufficiently large voltage is applied to terminal 140 with respect to terminal 138, intermediate portion 142 of region 112 becomes depleted of free carriers. As the applied voltage increases to Vt1, avalanche breakdown occurs across the base-collector spacing in portion 142 of region 112. Thus, the (forward) triggering voltage Vt1 at which avalanche breakdown occurs in transistor 124 can depend upon the base-collector spacing between P-well 118 and N-well 128 within transistor 124; the larger the spacing, the higher Vt1 and, conversely, the smaller the spacing, the smaller Vt1. As the applied voltage increases above Vt1, the avalanche breakdown generates carriers turning on NPN transistor 124 (Q1). NPN transistor 124 (Q1) then couples with PNP transistor structure Q3 so that the base of transistor 124 (Q1) also serves as and connects to the collector of transistor structure Q3, and the collector of transistor 124 (Q1) serves as and connects to the base of transistor structure Q3. The coupling between transistor 124 and transistor structure Q3 forms a parasitic silicon controlled rectifier (SCR). The parasitic SCR effects provide strong current capability for the device after the device snaps back and begins conducting.

Conversely, during a reverse ESD event, when a negative voltage is applied to terminal 140 with respect to terminal 138, transistor 124 acts as a forward-biased diode and transistor 126's base-collector junction is reverse biased.

Figure 8:
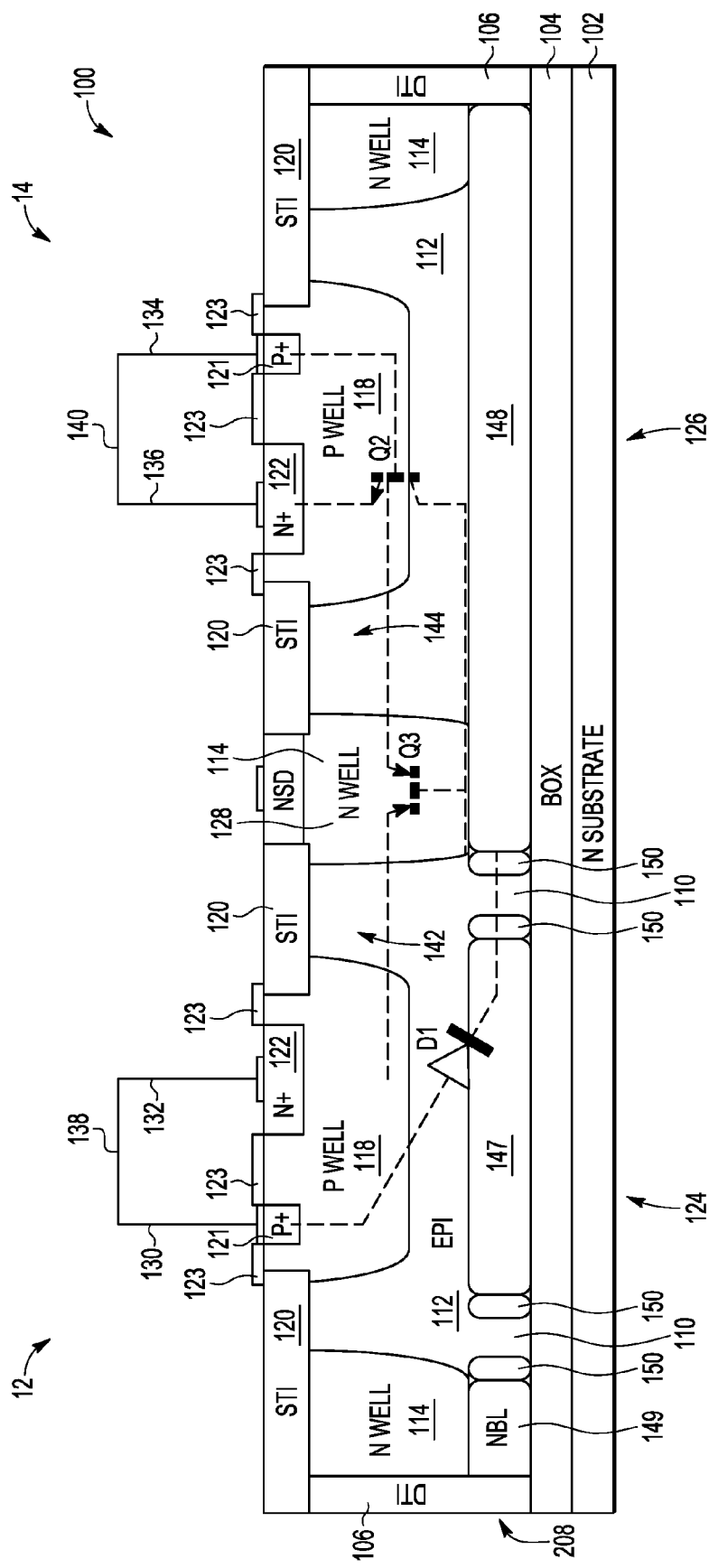
FIG. 8 illustrates a cross-sectional view of the ESD protection device of FIG. 7 during operation with a schematic representation overlay in accordance with an embodiment of the invention.

This example is illustrated by the overlay schematic in FIG. 8 illustrating a forward-biased diode D1 in place of transistor Q1. When a positive voltage with sufficiently large amplitude is applied to terminal 138 with respect to terminal 140, intermediate portion 144 of region 112 becomes depleted of free carriers. As the applied voltage increases to $Vt1_R$, avalanche breakdown occurs across the base-collector spacing in portion 144 of region 112. Thus, the reverse triggering voltage $Vt1_R$ at which avalanche breakdown occurs in transistor 126 can depend upon the base-collector spacing between P-well 118 and N-well 128 within transistor 126; the larger the spacing, the higher $Vt1_R$ and, conversely, the smaller the spacing, the smaller $Vt1_R$. As the applied voltage increases above $Vt1_R$, the avalanche breakdown generates carriers to turn on NPN transistor 126 (Q2). NPN transistor 126 (Q2) then couples with PNP transistor structure Q3 in a way that the base of transistor 126 (Q2) also serves as and connects to the collector of transistor structure Q3, and the collector of transistor 126 (Q2) serves as and connects to the base of Q3. The coupling between transistor 126 and transistor structure Q3 also forms a parasitic SCR. The parasitic SCR effects provide strong reverse current capability for the device after the device snaps back and start conducting.

The forward and reverse triggering voltages Vt1 and $Vt1_R$ may be substantially the same or different depending on whether the base-collector spacings in portions 142 and 144 are substantially the same or different.

In the arrangement shown in FIG. 7, transistor 124 controls the forward triggering of ESD protection device 100 during a forward ESD event. The parasitic SCR formed by transistor 124 and transistor structure Q3 controls the forward holding voltage of ESD protection device 100 after the applied voltage exceeds Vt1 for the device (and so the device begins to snapback and conduct current). Transistor 126 controls the reverse triggering of ESD protection device 100 during a reverse ESD event. The parasitic SCR formed by transistor 126 and transistor structure Q3 controls the reverse holding voltage of ESD protection device 100 after the applied voltage exceeds $Vt1_R$ for the device (and the device begins to snapback and conduct current).

In a conventional dual-polarity ESD protection device having a full, uniformly implanted NBL, a substantial amount of current flows through the NBL that is located under each transistor. However, in ESD device 100 as illustrated in FIGS. 7 and 8, NBL 108 is either not present between inner region 147 and outer region 148, 149 (resulting in ring region 110 and laterally diffused region 150) or present between inner region 147 and outer region 148, 149 but only with a relatively low doping concentration (resulting in laterally diffused region 150 but not necessarily in ring region 110). As a result, after the device is triggered, relatively little current flows through NBL 108 for transistor 124. This behavior increases the forward holding voltage, Vh, of the device, improving its performance for a forward ESD event. Forward and reverse operations can be symmetrical.

Figure 9:
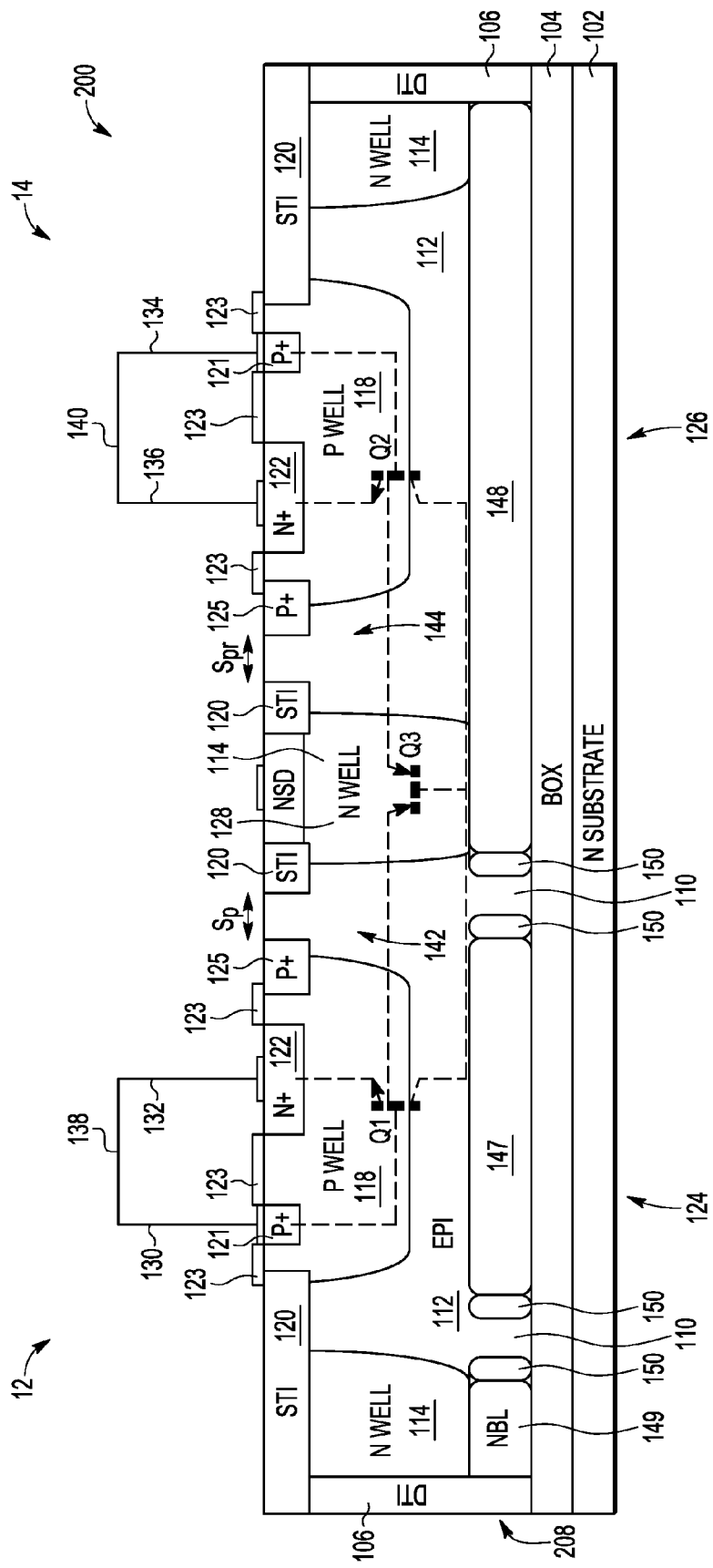
FIG. 9 illustrates a cross-sectional view of the ESD protection device of FIG. 6 during operation with a schematic representation overlay in accordance with an embodiment of the invention.

FIG. 9 schematically shows an example of an embodiment of an ESD protection device 200 produced on the basis of the device from FIG. 6. ESD protection device 200 is generally similar to ESD protection device 100 from FIG. 7. Only differences over ESD protection 100 will be described in the following.

ESD protection device 200 includes a first P+ trigger contact region 125 at the top surface of ESD protection device 200 and in direct contact with P-well region 118 in region 12 and with intermediate portion 142 of semiconductor region 112. Intermediate portion 142 of semiconductor region 112 extends through to the top surface of device 200, i.e. to the surface on which silicide block regions 123 are disposed. At the top surface of device 200, intermediate portion 142 of semiconductor region 112 has a width Sp. Intermediate portion 142 of semiconductor region 112 thus isolates first P+ trigger region 125, which is in direct contact with P-well region 118 and intermediate portion 142, from STI structure 120. The width Sp of intermediate portion 142 of semiconductor region 112 can be approximately equal to the width $W_R$ of ring region 110 (see FIGS. 5 and 6). This can result in a high holding voltage Vh. For example, the width Sp can be in the range of $0.8*W_R$ to $1.2*W_R$ (i.e. Sp=$W_R$±20%).

ESD protection device 200 further includes a second P+ trigger region 125 at the top surface of ESD protection device 200 and in direct contact with P-well region 118 in region 14 and with intermediate portion 144 of semiconductor region 112. Intermediate portion 144 of semiconductor region 112 extends through to the top surface of device 200, i.e. to the surface on which silicide block regions 123 are disposed. At the top surface of device 200, intermediate portion 144 of semiconductor region 112 has a width Spr. Intermediate portion 144 of semiconductor region 112 thus isolates second P+ trigger region 125, which is in direct contact with P-well region 118 and intermediate portion 144, from STI structure 120. The width Spr of intermediate portion 144 of semiconductor region 112 can be approximately equal to the width $W_R$ of ring region 110 (see FIGS. 5 and 6), as this can result in a high holding voltage Vh. For example, the width Spr can be in the range of $0.8*W_R$ to $1.2*W_R$ (i.e. Spr=$W_R$±20%).

First and second P+ trigger regions 125 (located in regions 12 and 14, respectively) can be relatively shallow but highly doped P regions and may include boron as a dopant. The peak doping density for P+ trigger regions 125 is in the range of about $5 \times 10^{19}$ cm$^{-3}$ to about $1 \times 10^{21}$ cm$^{-3}$. The depth of P+ trigger regions 125 can range from about 0.05 µm to about 0.3 µm. But other dopants, density and depths may also be used.

Figure 10:
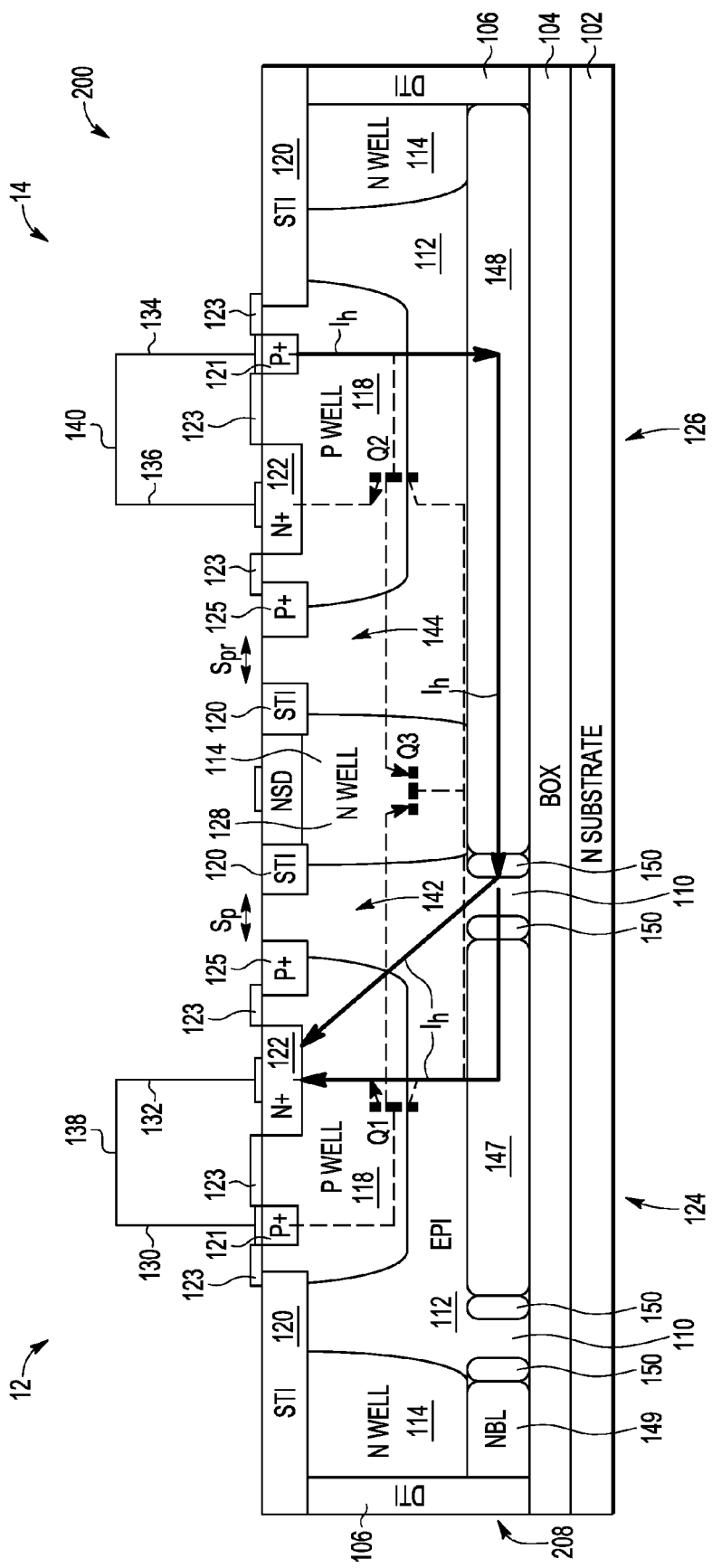
FIG. 10 illustrates a cross-sectional view of the ESD protection device of FIG. 9 during operation with a schematic overlay of an electrical current in accordance with an embodiment of the invention.

FIG. 10 schematically shows ESD protection device 200 during operation with a schematic overlay representing the flow of the holding current, of amplitude Ih, during a forward ESD event. In region 14, the holding current passes mainly through anode 140, P+ contact region 121, P-well 118, and portion 148 of outer region 148, 149 of NBL 108. From portion 148 of outer region 148, 149, a first part of the holding current continues through ring region 110 of semiconductor region 112, inner region 147 of NBL 108, semiconductor region 112, P-well region 118 (in region 12), N+ contact region 122, and cathode 138 while a second part of the holding current continues through semiconductor region 112, P-well region 118 (in region 12), N+ contact region 122, and cathode 138 without passing through inner region 147. The width $W_R$ of ring region 110 can be chosen such that the first part Ih1 of the holding current (which flows through the ring region 110) has an amplitude Ih1 in the range of $0.3*Ih$ to $0.7*Ih$ and that the second part $Ih_2$ of the holding current (which bypasses the ring region 110) has an amplitude Ih2 in the range of $0.3*Ih$ to $0.7*Ih$ (wherein it is understood that the sum of Ih1 and Ih2 does not exceed Ih). The applicant has carried out studies which suggest that choosing the ring width $W_R$ such that the first part Ih1 and the second part Ih2 of the holding current are approximately equal (e.g., 0.5<Ih1/Ih2<2) can result in a large holding voltage.

Figure 11:
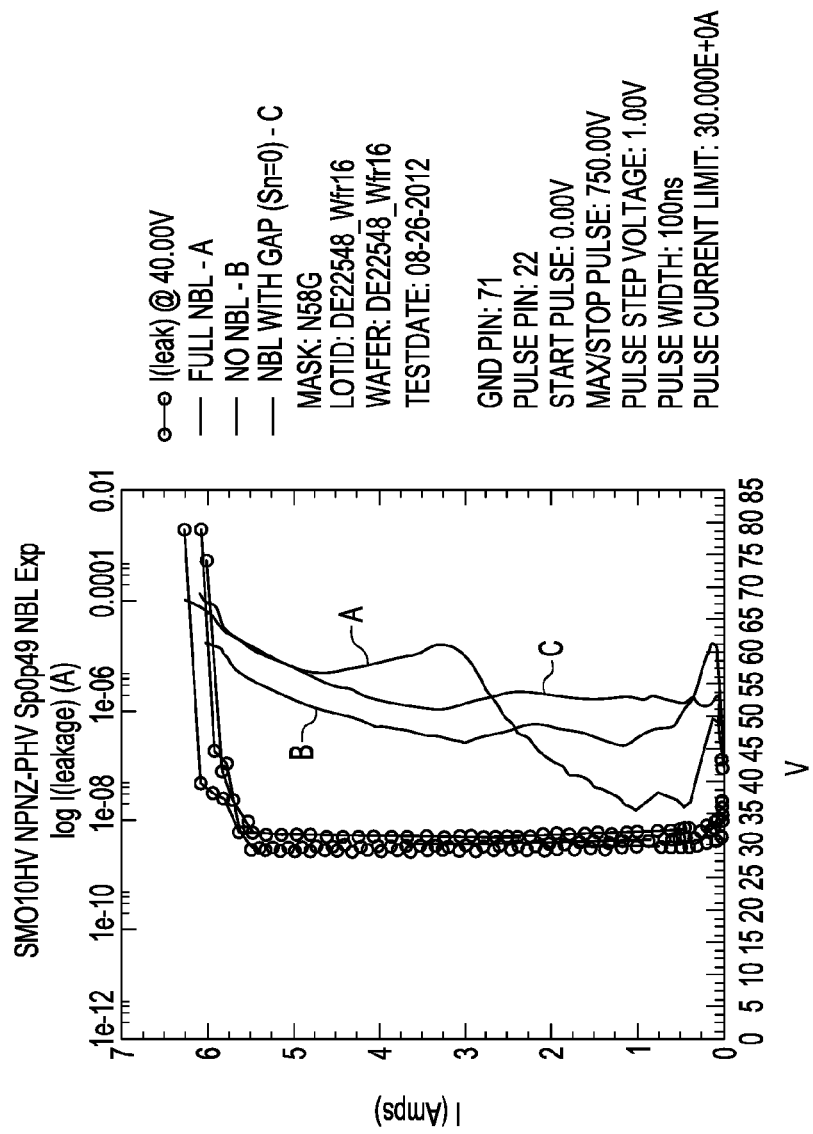
FIG. 11 shows a graph and a table with experimental results pertaining to three different ESD protection devices.

FIG. 11 shows a diagram with current-vs-voltage graphs A ("Full NBL"), B ("No NBL"), and C ("NBL with Gap") for three different ESD protection devices, along with a table indicating the holding voltage Vh, the triggering voltage Vt1, and the current capability It2 determined from the graphs. Graph A refers to a first ESD protection device similar to ESD protection device 200 but including an NBL layer which is continuous through regions 12 and 14. Graph B refers to a second ESD protection device similar to ESD protection device 200 but not having an NBL layer in device 12 (inner region 147 is absent in ESD protection device of graph B). Graph C refers to an ESD protection device like ESD protection device 200 described above. As seen, ESD protection 200 has a holding voltage Vh of 51.6 V. This is significantly higher than the holding voltages Vh=36.0 V and Vh=45.1 V of the first and second ESD protection devices, respectively.

Since ESD protection device 100 can be constructed using silicon-on-insulator fabrication process, the ESD protection device may be isolated by buried oxide layer (BOX) and deep trench isolation (DTI), as described above. This configuration allows the device to be stacked. This capability minimizes device footprint when a number of the ESD protection devices are stacked over one another. The stacking of the ESD protection devices allows for the formation of a single ESD protection clamp that includes a number of ESD protection devices and that can provide an increased Vh.

When stacked within an ESD protection clamp, two or more ESD protections devices are formed next to one another in a single substrate. The ESD protection devices are then connected in series (i.e., stacked) with the cathode of one ESD protection device being electrically connected to the anode of the next ESD device. The anode of the first ESD protection device in the stack provides a positive input or anode terminal for the ESD protection clamp. Similarly, the cathode of the last ESD protection device in the stack provides a negative input or cathode terminal for the ESD protection clamp. The positive and negative input terminals of the ESD protection clamp can then be connected to an IC device to provide protection thereto.

Figure 12A:
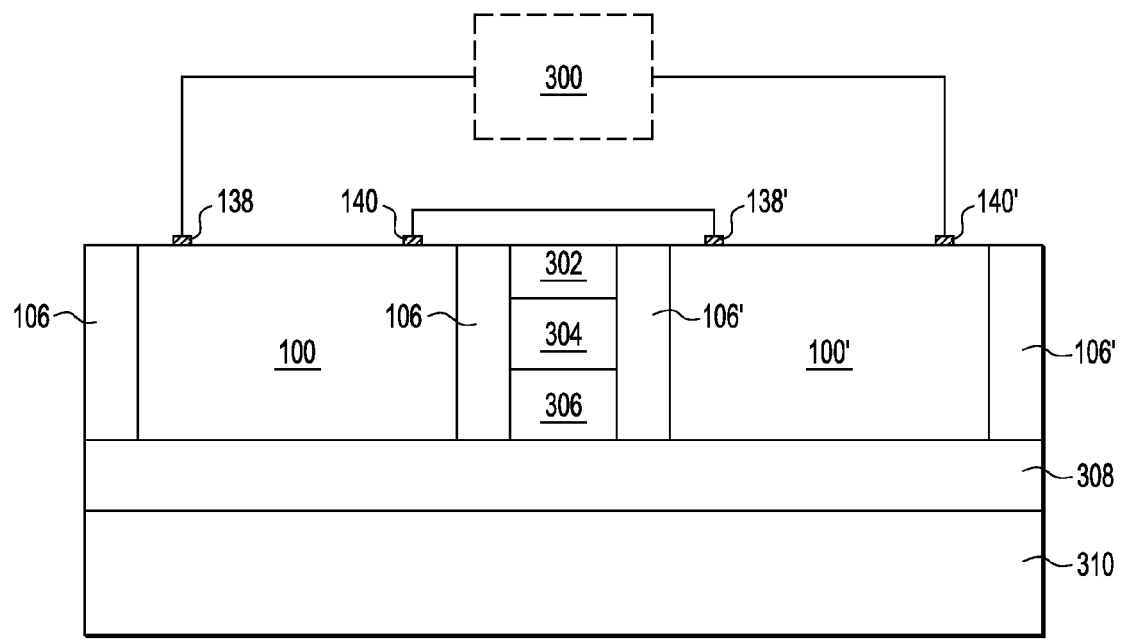
FIGS. 12A and 12B illustrate cross-sectional views of an electrostatic discharge protection clamp including two stacked ESD protection devices in accordance with various embodiments of the invention.
Figure 12B:
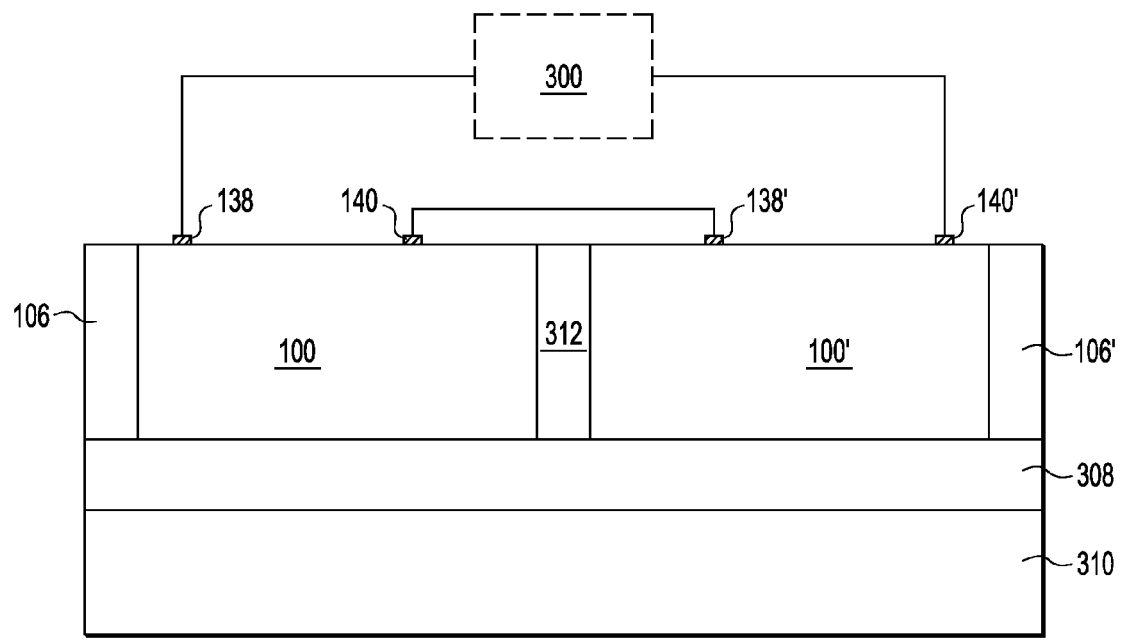

FIGS. 12A and 12B, for example, are cross-sectional views of an ESD protection clamp that includes two stacked ESD protection devices. In FIG. 12A two ESD protection devices 100 and 100' are connected in series, though other devices or clamps could include more than two series-connected ESD protection devices. In the arrangement shown in FIG. 12A, device 100' is the first ESD protection device in the stacked device and device 100 is the second ESD protection device.

Each of devices 100 and 100' in FIG. 12A is configured in accordance with the example device 100 shown in FIG. 8 or 9. However, the DTI regions 106 of each device have been duplicated in FIG. 12A. FIG. 12A also shows the substrate 310 and BOX layer 308 over which each ESD protection device is formed.

Each of the devices 100 and 100' are electrically isolated by DTI regions 106 (DTI regions 106 surround device 100 and DTI regions 106' surround device 100) from N type or P type region (formed by epitaxial deposition) 306 and in some embodiment P well region 304. STI structure 302 is provided for additional isolation.

To interconnect the devices, cathode 138' of device 100' is connected to anode 140 of device 100, thereby connecting devices 100 and 100' in series. The anode 140' of device 100' is connected to a first terminal (e.g., a positive terminal at Vpos) of IC device 300. The cathode 138 of the stacked ESD protection device 100 is connected to a second terminal (e.g., a negative terminal at Vneg) of IC device 300. In this configuration, the stacked ESD protection devices 100 and 100' operate as an ESD protection clamp to provide protection to IC device 300.

FIG. 12B is a cross-sectional view showing two stacked ESD protection devices 100 and 100', where the devices are isolated from one another using an alternative trench structure. In FIG. 12B, devices 100 and 100' of FIG. 12A are separated by a single DTI trench region 312 that provides electrical isolation between the two devices 100 and 100'. In this arrangement, device 100' is the first ESD protection device in the stacked arrangement and device 100 is the second ESD protection device.

Again, the cathode 138' of device 100' is connected to the anode 140 of device 100, connecting devices 100 and 100' in series. The anode 140' of device 100' is connected to a first terminal of IC device 300, where IC device 300 is to be protected by the stacked ESD protection device. The cathode 138 of the stacked ESD protection device 100 is connected to a second terminal of IC device 300.

Using the configuration shown in FIGS. 12A and 12B any number of ESD protection devices can be combined, in series, to form an ESD protection clamp. The anode of the first ESD protection device in the stack and the cathode of the last ESD protection device in the stack can then be connected to an IC device to provide protection thereto.

When two or more ESD protection devices are stacked as shown in FIG. 12A or FIG. 12B, the holding voltage Vh of the entire stacked device is equal to the sum of the holding voltages of each of individual ESD protection devices 100. As such, to provide a protection device that targets a holding voltage of 30 V, a stack that includes two or more ESD protection devices connected in series can be used. For example, the holding voltage of each individual ESD protection device may be approximately 15 V. In the example described above regarding the reverse double battery event of about 28 V, a holding voltage of 30 V remains within the allowable limit. The doping profile of NBL 108 can therefore be used to control the holding voltage of ESD protection devices, and ESD protection devices can be stacked in series as needed to provide the desired final holding voltage.

Therefore, by now it can be appreciated how the doping profile of a buried layer below one or both transistors of a bi-directional ESD protection device can be used to control the holding voltage of the ESD protection device. For example, a ring-shaped masking layer can be used for an implant into a semiconductor layer to form a buried layer having a heavily doped inner region and a heavily doped outer region, the inner region being surrounded by an undoped or lightly doped ring region. The ring region separates the inner region from the outer region. The electrical resistance between the inner region and the outer region can be controlled by the width $W_R$ of the ring region. The greater the width of the ring region, the larger the electrical resistance between the heavily doped inner region and the heavily doped outer region. In this manner, holding voltages of the ESD protection device can be controlled. A lightly doped ring region can result from lateral diffusion of the implant into the ring-shaped region that was covered by the ring-shaped masking layer. A lightly doped ring region can have generally the same effect as a strictly undoped ring region.

The preceding detailed description is exemplary in nature and is not intended to limit the invention or the application and uses of the same. Furthermore, there is no intention to be bound by any expressed or implied theory presented in the preceding technical field, background, or the following detailed description.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

Although the present disclosure describes specific examples, embodiments, and the like, various modifications and changes can be made without departing from the scope of the disclosure as set forth in the claims below. For example, although the exemplary methods, devices, and systems described herein are in conjunction with a configuration for the aforementioned device, the skilled artisan will readily recognize that the exemplary methods, devices, and systems may be used in other methods, devices, and systems and may be configured to correspond to such other exemplary methods, devices, and systems as needed. Further, while at least one embodiment has been presented in the foregoing detailed description, many variations exist. Accordingly, the specification and figures are to be regarded in an illustrative rather than a restrictive sense, and all such modifications are intended to be included within the scope of the disclosure. Any benefits, advantages, or solutions to problems that are described herein with regard to specific embodiments are not intended to be construed as a critical, required, or essential feature or element of any or all of the claims.

The invention claimed is:

1. An electrostatic protection device coupled between a first terminal and a second terminal of an integrated circuit, comprising:
    a buried layer having an outer region and an inner region which are heavily doped regions of a first conductivity type, the inner region being surrounded by a ring region which is an undoped or lightly doped ring-shaped region and which is surrounded by the outer region;
    a semiconductor region over the buried layer;
    a first well of the first conductivity type in the semiconductor region, extending from a surface of the semiconductor region to a main region of the outer region of the buried layer;
    a first transistor in the semiconductor region having an emitter coupled to the first terminal; and
    a second transistor in the semiconductor region having an emitter coupled to the second terminal,
    wherein the first well forms a collector of the first transistor and a collector of the second transistor, and wherein the buried layer is located below at least one of the first transistor and the second transistor.

2. The electrostatic protection device of claim 1, wherein the buried layer is located below only one of the first transistor and the second transistor.

3. The electrostatic protection device of claim 1, wherein the inner region of the buried layer is rectangular in a plane parallel to a major surface of the buried layer.

4. The electrostatic protection device of claim 1, wherein the semiconductor region is of a second conductivity type different from the first conductivity type.

5. The electrostatic protection device of claim 1, further comprising a substrate and an insulating layer over the substrate, wherein the buried layer and the semiconductor region are located over the insulating layer.

6. The electrostatic protection device of claim 1, wherein the ring region has a width adapted to maximize a holding voltage of the electrostatic protection device.

7. The electrostatic protection device of claim 1, comprising:
    a first trigger region of a second conductivity type different from the first conductivity type and in contact with the first transistor and the semiconductor region;
    a first shallow trench isolation structure in contact with the first well and the semiconductor region;
    wherein the semiconductor region includes a first gap region located between the first trigger region and the first shallow trench isolation structure and having a width similar to a width of the ring region.

8. The electrostatic protection device of claim 1, comprising:
    a second trigger region of a second conductivity type different from the first conductivity type and in contact with the second transistor and the semiconductor region;
    a second shallow trench isolation structure in contact with the first well and the semiconductor region;
    wherein the semiconductor region includes a second gap region located between the second trigger region and the second shallow trench isolation structure and having a width similar to a width of the ring region.

9. The electrostatic protection device of claim 1, wherein the area of the inner region parallel to a major surface of the buried layer is between 25% and 45% of the area of the outer region parallel to the major surface of the buried layer.

* * * * *